June 1, 1965 E. J. NALOS 3,187,192

COMPOUND PARAMETRIC AND ELASTIC WAVE SOLID-STATE AMPLIFIERS

Filed Feb. 3, 1964 2 Sheets-Sheet 1

INVENTOR.
ERVIN J. NALOS

BY Reynolds & Christensen

ATTORNEYS

June 1, 1965 E. J. NALOS 3,187,192

COMPOUND PARAMETRIC AND ELASTIC WAVE SOLID-STATE AMPLIFIERS

Filed Feb. 3, 1964 2 Sheets-Sheet 2

INVENTOR.
ERVIN J. NALOS

BY Reynolds & Christensen

ATTORNEYS

United States Patent Office 3,187,192
Patented June 1, 1965

3,187,192
COMPOUND PARAMETRIC AND ELASTIC WAVE SOLID-STATE AMPLIFIERS

Ervin J. Nalos, Bellevue, Wash., assignor to The Boeing Company, Seattle, Wash., a corporation of Delaware Filed Feb. 3, 1964, Ser. No. 341,888
20 Claims. (Cl. 307—88.3)

The present invention relates to amplifiers which make use of solid-state components and more particularly to an improved class of high frequency amplifiers operating over a wide frequency range and using parametric amplification techniques in combination with amplification obtained by the interaction of a compressional wave and free charge carriers in a semiconductor material.

High frequency amplifiers find many uses at the present time in signal generating and receiving systems such as radar and microwave communication systems. Sensitive receivers and amplifiers are required in such systems, and particularly when long ranges are involved and the apparatus must provide output signals of sufficient strength to be readily utilized in data display or information reduction systems. It is an object of the present invention to provide improved high gain solid-state amplifiers which are readily usable in such high frequency signal translating and receiving systems.

It is a further object of the present invention to provide improved high frequency amplifiers using parametric amplification techniques in combination with a technique of obtaining signal amplification within a piezoelectric material by means of the interaction of free electrons and traveling waves launched in the material as a result of the piezoelectric phenomenon.

An additional object of the present invention is to provide improved amplifiers which use parametric amplification techniques but which require very low power pump sources and yet provide substantial amplification of high frequency signals.

Another object of the present invention is to provide an improved high frequency signal translating apparatus utilizing solid-state components of rugged design in an arrangement which eliminates the necessity of high vacuum fabrication techniques and wherein a vacuum need not be sustained during operation of the amplifier.

Another object of the present invention is to provide an improved amplifier making use of parametric amplification techniques utilizing a very low energy pump in combination with amplification provided by the interaction between free electrons and compressional waves in a piezoelectric semiconductor.

These objects are achieved in accordance with the teachings of the present invention through the use of an element which includes a piece of semiconductor material having the characteristic that interaction of a compressional wave and drifting charge carriers will take place in the material in a manner to cause amplification of the wave. Variable capacitance devices which assist in launching of compressional waves in the material are part of the element and are so located in resonant members that parametric amplification occurs. The material is preferably a piezoelectric semiconductor since such material has the characteristic that an appropriate electric field will cause the release and acceleration of charge carriers which then interact with and cause amplification of a compressional wave propagating in the material. The variable capacitance devices are of the type which undergo a variation in capacitance in response to variations in an electric field to which the devices are subjected. In accordance with one embodiment of the invention the variable capacitance devices are in the form of depletion layer semiconductor devices which are secured to opposite ends of a rod of piezoelectric semiconductor material and matched to obtain minimum transmission loss. The opposite ends of the rod of piezoelectric semiconductor material having the variable capacitance devices secured thereto are disposed within a pair of high frequency cavity resonators. A longitudinal electric field is established in the material to cause release and movement of electrons therein. A high frequency pump signal and a signal to be amplified are introduced into one of the RF cavities which is resonant at the frequencies of the signal to be amplified and the pump signal. Variations in the capacitance of the variable capacitance device in the cavity caused by the pump signals leads to parametric amplification of the signals to be amplified. The pump frequency signals and the signals to be amplified also cause compressional waves to be launched within the piezoelectric semiconductor material. As these compressional waves travel down the length of the piece of semiconductor material an interaction between the compressional waves and the drift electrons therein causes amplification of the compressional waves. Such amplified compressional waves upon arrival at the other end of the piece of material cause amplified RF signals to be introduced in the second cavity due to the reverse piezoelectric effect. The amplified signals thus provided to the second cavity will include pump frequency signals as well as signals to be amplified. The second cavity is also resonant at both frequencies and therefore the presence of the second variable capacitance device results in further parametric amplification of the signals to be amplified. Therefore substantially amplified signals are provided in the second cavity and can be withdrawn therefrom by conventional techniques.

In one embodiment of the invention two resonant cavities are coupled by suitable feed-back means so that signals from the second cavity are fed back to the first cavity to permit further parametric amplification and also cause additional compressional waves of increased amplitude to be launched within the piezoelectric semiconductor material. As a result of the feed-back arrangement and associated build up of the pump frequency signals the power requirements of the source of pump signals is materially reduced. The gain is preferably so adjusted that self-oscillation does not occur.

Various other embodiments of the invention are illustrated which make use of parametric amplification and compressional wave-drift electron interaction amplification techniques. Amplification of high frequency signals is thus obtained utilizing low energy pump signal sources which is particularly advantageous in high frequency applications. In one embodiment of the invention signals from a local oscillator are introduced into a resonant cavity together with signals to be received and demodulated. One end of a rod of piezoelectric semiconductor material having a variable capacitance device thereon is disposed within the cavity. As a result parametric amplification takes place and compressional waves at the signal and local oscillator frequencies are launched in the piezoelectric semiconductor material. A D.C. field is established within the material to cause movement of free charge carriers which interact with such compressional waves to cause amplification of the various signal frequencies present which include the sum and difference frequencies. A suitable frequency selecting circuit is connected to the other end of the material so that the reverse piezoelectric effect which takes place at said other end will cause demodulated and amplified intermediate frequency signals to be applied to a utilization device. The variable capacitance device secured to the input end of the semi-conductor material not only provides parametric amplification but also enhances launching of the compressional waves. Thus a simplified and compact demodulator operable at very high frequencies is provided.

The above and additional objects and advantages of the present invention will be more clearly understood from the following description when read with reference to the accompanying drawings wherein, FIGURE 1 is an isometric view with a section removed to illustrate a preferred embodiment of the present invention which includes a pair of cavity resonators and a composite variable capacitance-piezoelectric device with suitable signal feed-back in the amplifier to enhance the amplification and reduce the power requirements of a high frequency pump;

Figures 1, 1A:
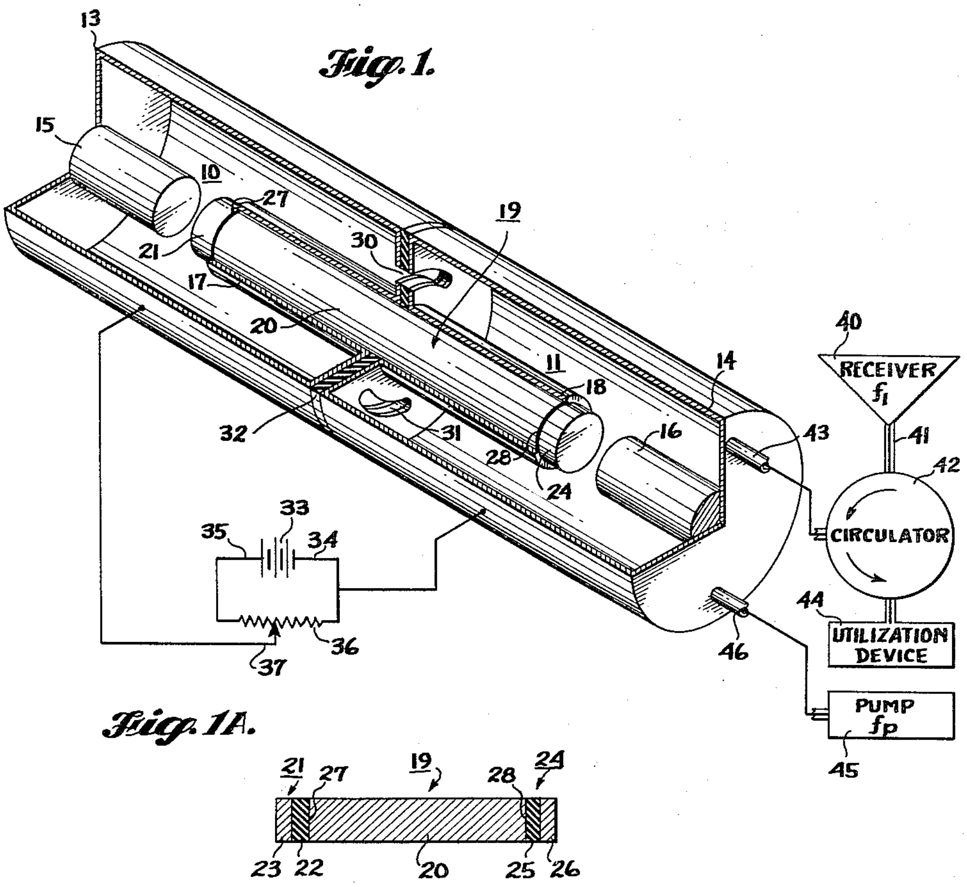
FIGURE 1A is an enlarged cross-sectional view of a composite piezoelectric and variable capacitance apparatus shown for purpose of illustration as one type of apparatus suitable for use in the amplifiers of the present invention.
Figure 4:
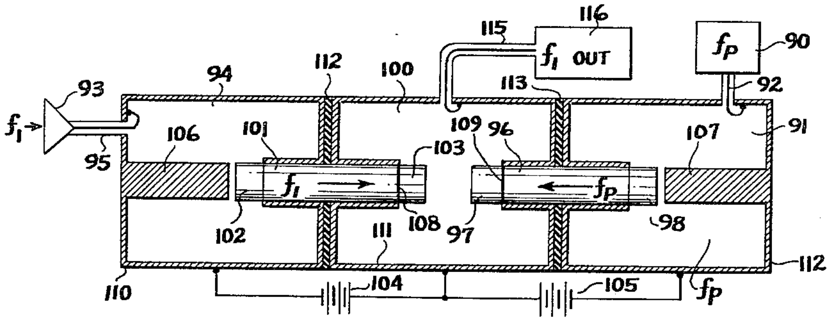
Figure 5:
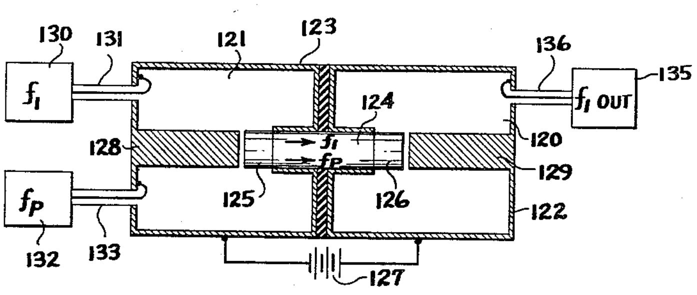

FIGURE 4 is a schematic circuit diagram of an embodiment of the invention with separate rods of piezoelectric semiconductor material being shown in a side view within cross-sectional RF cavities with the separate rods being respectively used for amplifying the input signals and the pump signals prior to the parametric amplification of the input signals in a separate cavity by the amplified pump signals; and FIGURE 5 is a schematic circuit diagram similar to that of FIGURE 1 with the RF cavities shown in cross section and the piezoelectric semiconductor rod shown in a side view.

Referring now to the drawings and in particular to FIGURE 1 there is illustrated an isometric view and circuit diagram of a preferred embodiment of the invention which utilizes RF feed-back techniques to enhance the amplification of a pump signal as well as of an input information signal to be amplified. It will be seen in FIGURE 1 that the apparatus includes first and second resonators shown as resonant cavities 10 and 11 defined by first and second conductive members 13 and 14. Members 13 and 14 are thin walled right circular cylinders having centrally located solid re-entrant stubs 15 and 16 of conductive material. The members 13 and 14 also have central axially aligned conductive members 17 and 18 which are shown as hollow right circular cylinders. Members 17 and 18 are adapted to hold a signal translating element 19. The element 19 includes a central semiconductor device 20 in the shape of a rod composed of semiconductor material which exhibits piezoelectric characteristics and has the further characteristic that free electrons are released therein by an appropriate electric field. The ends of the element 19 include devices 21 and 24 which vary in capacitance in response to variations in the intensity of an applied electric field. The element 19 having these characteristics may be constructed by suitable crystal growing and doping techniques or as shown for purpose of illustration in FIGURE 1 the element 19 includes separate devices 21 and 24 respectively connected to opposite ends of the piezoelectric semiconductor device 20 and respectively disposed within the RF cavities 10 and 11. The devices 21 and 24 are connected to the piezoelectric material by means of vacuum deposition and soldering at the joints 27 and 28. In the embodiment illustrated in FIGURE 1 the joints 27 and 28 are in electrical contact with the associated conductive holding members 17 and 18.

The conductive members 13 and 14 and their associated integral parts 15 and 17, and 16 and 18, are electrically insulated from each other by the electrical insulation 32. Signal feedback or coupling means for coupling cavities 10 and 11 for interchange of RF energy is provided by the feed-back slots 30 and 31. A battery 33 having its negative and positive terminals 34 and 35 connected to a resistor 36 provides a longitudinal electric field in the device 20 since the negative terminal 34 is connected to the member 14 and a voltage tap 37 in contact with resistor 36 is connected to member 13 and, as set forth above, joints 27 and 28 are in contact with members 17 and 18. The field intensity is such that electrons in the semiconductor rod 20 are released and move toward the stub 15. The release of electrons may be enhanced by the use of electromagnetic radiation (such as light) focused on the rod 20 in any suitable manner. The intensity of the electric field is preferably adjusted so that the velocity of the electrons corresponds generally to (or is slightly greater than) the propagation velocity of the compressional waves in the piezoelectric material.

The variable capacitance devices 21 and 24 can be any of a number well known in the art, and as stated above can be constructed as an integral part of the piezoelectric semiconductor device 20. As is known in the art, many semiconductor materials will exhibit not only piezoelectric characteristics but also when properly doped exhibit capacitance variation characteristics. The devices 21 and 24 can also be junction semiconductor devices adapted to have a space charge region established in the vicinity of the junction, such region causing the required variations in capacitance in response to variations in applied electric field. U.S. Patent No. 3,094,671 to Garrett et al. discloses a number of semiconductor devices which exhibit the desired characteristic of variation in capacitance in response to a variation in applied electric field strength. As disclosed in the Garrett et al. patent, depletion layer semiconductor devices or devices having layers of accumulated charge carriers in the semiconductor material are found to exhibit the required variations in capacitance. For purpose of illustration and for teaching the present invention there is shown in FIGURE 1A a composite element 19 which includes a central device 20 of piezoelectric semiconductor material cadimum sulfide (CdS). The devices 21 and 24 include layers of dielectric material and layers of suitable semiconductor material including layers 22 and 25 of silicon oxide ($SiO_2$) and layers 23 and 26 of N-type silicon. Layers of indium are vapor deposited to facilitate soldering of devices 21 and 24 to device 20 at the junctures 27 and 28. The vapor deposited layers 27 and 28 protrude slightly from the external surface of the element 19 so that when the element 19 is inserted in the members 17 and 18 electrical contact is made by the layers 27 and 28 with the members 17 and 18. In the illustration of FIGURE 1 the element 19 including device 20 is shown somewhat enlarged to better illustrate the apparatus. In practice the device 20 may be in the order of ten millimeters in length although the exact length is not critical. The length of the rod is so selected that the gain is such that oscillations are avoided (unless an oscillator is desired).

An RF receiver 40 will be seen to be connected via a coaxial cable or waveguide 41 to a circulator 42 so that signals of a frequency $f_1$ which are received by the receiver 40 are directed to the circulator 42 and thence via coaxial cable 43 to the cavity 11, the cable 43 being terminated in the cavity 11 in the conventional manner. While coaxial cables are shown for purpose of illustration it is to be understood that other RF signal transmission devices such as waveguides could be used in place of the cables. Output signals from the cavity 11 are provided via coaxial cable 43 to the circulator 42 and thence to any of a number of suitable utilization devices 44. Signals at a higher frequency $f_p$ are provided by a source of pump power 45 and are fed to the cavity 11 by a coaxial cable 46.

The operation of the embodiment of the invention illustrated in FIGURE 1 is as follows. Signals at frequency $f_1$ which are to be amplified are received by the receiver 40 and directed through circulator 42 into the cavity 11. Simultaneously therewith signals at a suitable pump frequency $f_p$ are introduced into the cavity 11 via cable 46. The presence of the pump signals at frequency $f_p$ will result in proportional variation in capacitance of the semiconductor device 24 and hence low noise parametric amplification of the signal $f_1$ will take place in a manner known in the art with the required energy being provided by the pump source 45. In addition however, due to the piezoelectric characteristics of the device 20 compressional waves will be launched within the device 20. The compressional waves will interact with drift electrons within the material which are moving from right to left in the field established by battery 33 in FIGURE 1. This interaction of the electrons with the traveling compressional waves near synchronism is analogous to the interaction of electrons and electromagnetic waves which takes place in a traveling wave tube. As a result of the interaction the compressional wave is amplified at the expense of energy derived from the source of D.C. potential 33. The amplified compressional wave upon reaching the opposite end of the device 20 causes the reverse piezoelectric effect to take place and hence amplified RF signals are established in the cavity 10. The signals in cavity 10 will include both pump frequency signals $f_p$ and the signals at frequency $f_1$. The pump signals $f_p$ cause variations in the capacitance of the device 21 and hence further parametric amplification of signals $f_1$ takes place in the cavity 10. As is well known in the art, the cavities 10 and 11 are made resonant at the two frequencies $f_1$ and $f_p$ and hence even though a number of sum and difference frequencies are present the predominant parametric amplification will be amplification of the signals $f_1$ at the expense of the pump signals $f_p$.

The slots 30 and 31 provide a feed-back path for RF energy from cavity 10 to cavity 11 and thus it will be seen that the above described operation will continue with a build-up occurring in the amplitude of signals at frequency $f_1$. In addition, it will be seen that the pump frequency signals will be amplified by the compressional wave-electron interaction which reduces the power requirement of the pump source 45. Thus a combined parametric amplification and interaction of an acoustic or compressional wave with drift current carriers in the semiconductor material 20 takes place with a materially amplified signal at frequency $f_1$ being provided to the utilization device 44. Since the pump frequency signals are amplified within the device by the interaction of the compressional waves in the material 20 with the drift electrons therein it will be seen that the power of the pump 45 can be very small. This is of a particular advantage when the system is operating in the millimeter wave region since the frequency of the pump signals is normally higher than the frequency of the signals to be amplified and thus in such applications the frequency of the pump source 45 is extremely high.

The interaction of compressional waves with drift charge carriers within the piezoelectric semiconductor material leads to broad band amplification and therefore the apparatus lends itself well to uses wherein high frequency signals are mixed with the signals from a local oscillator to produce an amplified intermediate frequency output signal. In the embodiment of the invention illustrated in FIGURE 2 it will be seen that the receiver 40 is connected via a coaxial cable 41 directly to the resonant cavity 11 defined by the member 14 which is substantially identical to the member 14 of FIGURE 1. The member 14 includes a re-entrant post 16 and also a central axially aligned hollow cylindrical container 18. Signals from a local oscillator 50 are coupled to the cavity 11 via coaxial cable 51 which is terminated in the cavity 11. In the embodiment of the invention illustrated in FIGURE 2 a rod of piezoelectric semiconductor material 52 has a variable capacitance device 53 secured to the left end thereof and disposed within the portion 18 of the member 14. As in the case of FIGURE 1, the device 53 includes a semiconductor oxide layer 54 and a layer of semiconductor material 55. In a similar manner a second variable capacitance device 56 is secured to the opposite end of the rod of piezoelectric semiconductor material 52 and includes an oxide layer 57 and a layer of semiconductor material 58. However, the device 56 is provided with an additional layer of vacuum deposited material such as a layer of indium 59 which provides a convenient means for soldering leads 60 and 61 to the device 56. A second layer of vacuum deposited material 67 such as indium is disposed between the oxide layer 57 and the piezoelectric material 52 to facilitate connection of device 56 to the material 52 and also to serve as a soldering surface for a lead 66.

A longitudinal high intensity electric field is established within the piezoelectric material 52 by means of a source of D.C. potential illustrated as a battery 62 having its negative terminal connected to the conductive member 14 and its positive terminal connected through a variable resistor 63 to the layer 59 of conductive material deposited on the end of the device 56. It will be noted that the direction of the field is such that freed electrons in the material 52 will be accelerated from left to right in FIGURE 2. A frequency selective circuit including an inductor 65 connected by lead 60 to the layer 59 and by the lead 66 to the layer 67 serves to provide signals at a selected frequency to a suitable utilization device 68. As described below, the utilization device 68 may be one which operates at an intermediate frequency and hence would normally include IF amplifiers.

Figure 2:
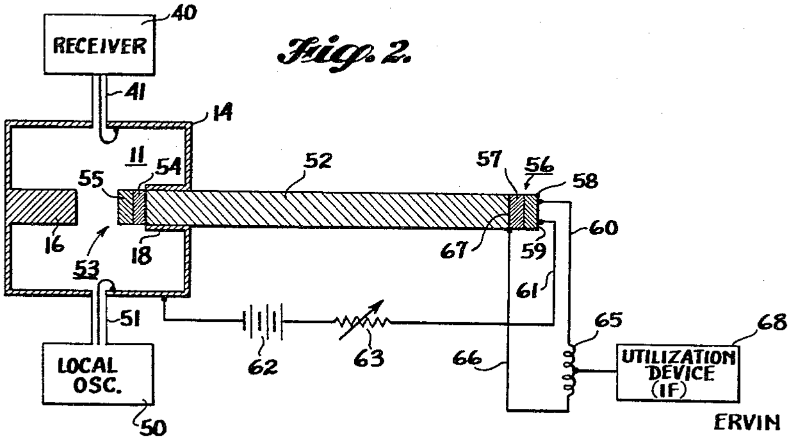
FIGURE 2 is a composite cross-sectional view and schematic circuit diagram of a high frequency demodulator adapted to receive high frequency signals and provide intermediate frequency output signals.

The operation of the apparatus of FIGURE 2 is similar to that of the apparatus in FIGURE 1 in that parametric amplification of the signals at frequency $f_1$ introduced into the cavity 11 by the receiver 40 will take place in the cavity. These signals in cavity 11 cause compressional waves to be launched within the piezoelectric semiconductor material 52 which will interact with the drift electrons in the material causing amplification of the compressional waves. These compressional waves will include components at frequencies $f_1$, $f_p$, and also multiples of the sum and difference frequencies due to nonlinearities of the amplifying medium. The tuned circuit connected to the device 56 is preferably tuned to a frequency equal to $f_1-f_p$. Therefore, only the amplified signals at the selected frequency of $f_1-f_p$ which are generated by the reverse piezoelectric effect upon arrival of the compressional waves at the right end of the rod 52 will serve to provide signals to the utilization device 68. Thus it will be seen that high frequency signals at a frequency $f_1$ are received, amplified, and demodulated to an intermediate frequency by the compact apparatus of FIGURE 2.

Figure 3:
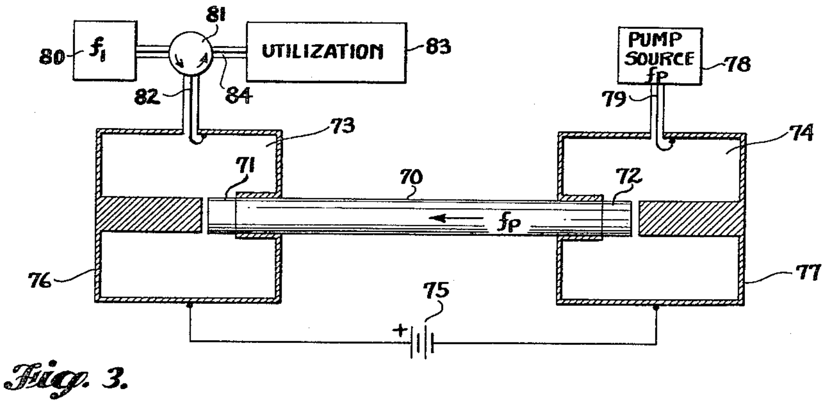
FIGURE 3 is a schematic circuit diagram which includes two cavity resonators shown in cross section together with a side view of a combination variable capacitance and piezoelectric device adapted to provide parametric amplification of signals using pump frequency signals which have been amplified by drift electron-compressional wave interaction.

In the embodiment of the invention illustrated in FIGURE 3 a rod of piezoelectric semiconductor material 70 has a variable capacitance device 71 and a device 72 used to launch the acoustic wave connected to opposite ends thereof and disposed within the RF resonant cavities 73 and 74. A battery 75 having its positive terminal connected to the conductive walls of the member 76, which defines cavity 73, and its negative terminal connected to the walls of the conductive members 77, which defines the cavity 74, provides an appropriate field to cause release and acceleration of electrons from right to left in FIGURE 3 within the piezoelectric semiconductor material 70. A pump signal source 78 operating at frequency $f_p$ is coupled with the cavity 74 by the coaxial cable 79. A receiver 80 serves to direct signals at a frequency $f_1$ to a circulator 81 and thence into the cavity 73 via the coaxial cable 82. Output signals are derived for the utilization device 83 via the coaxial cable 82, circulator 81 and coaxial cable 84. The cavity 73 is tuned to be resonant at frequencies $f_p$ and $f_1$. The cavity 74 is tuned to be resonant at the frequency $f_p$.

The operation of the embodiment illustrated in FIGURE 3 is similar to that of FIGURE 1. The devices 71 and 72, which may be depletion layer semiconductor devices, provide the coupling of electromagnetic energy to the piezoelectric material and also establish electromagnetic fields in cavity 73 as a result of the reverse piezoelectric effect and variations in capacitance.

Energy at the frequency $f_p$ which is introduced into the cavity 74 will cause compressional waves at a frequency $f_p$ to be launched within the material 70. These compressional waves interact with drift electrons causing amplification of the pump frequency signals. The reverse piezoelectric effect at the left end of rod 70 provides signals which vary the capacity of device 71 at a rate equal to or proportional to the frequency $f_p$. This in turn produces parametric amplification of the signals at frequency $f_1$ so that the utilization device 83 is provided with amplified signals of frequency $f_1$. By using the apparatus of FIGURE 3 a low power pump source 78 can be utilized.

In the embodiment of the invention illustrated in FIGURE 4 signals from a pump source 90 are introduced into a first cavity 91 resonant at frequency $f_p$ via a coaxial cable 92. Signals at a frequency $f_1$ are received by a receiver 93 and introduced into a second RF cavity 94 resonant at frequency $f_1$ via a coaxial cable 95. A first compressional wave amplification device illustrated as a rod of piezoelectric semiconductor material 96 has a variable capacitance device 97 secured to one end thereof and disposed within a cavity 100 resonant at frequencies $f_1$ and $f_p$. A compressional wave launching device or transducer 98 (such as a quartz crystal) is secured to the end of the rod 96 disposed within cavity 91 to aid in the launching of compressional waves in the rod. In a similar manner a second compressional wave amplification device which includes a second rod of piezoelectric semiconductor material 101 has a compressional wave launching device 102 secured to the left end thereof in cavity 94 to aid in the launching of compressional waves in the rod 101. A compressional wave transducer 103 is secured to the right end of rod 101 within the cavity 100. Electric accelerating fields are applied longitudinally by batteries 104 and 105 to the rods 96 and 100 between the conductive stubs 106 and 107 and the associated conductive layers 108 and 109 which will be seen to be in electrical contact with and disposed in cavity 100. The conductive layers 108 and 109 are shown enlarged in FIGURE 4, whereas in practice they are thin vapor deposited layers. It will be seen in FIGURE 4 that the negative terminals of batteries 104 and 105 are respectively connected to conductive members 110 and 112 defining cavities 94 and 98. The positive terminals of both batteries are connected to the conductive member 111 defining the cavity 100 and therefore electrons freed in the two rods 101 and 96 will be accelerated toward the central cavity 100. Suitable insulating material 112 and 113 separates the members 110, 111, and 112.

In the embodiment of the invention illustrated in FIGURE 4 interaction of the compressional waves initiated by the signals $f_1$ and $f_p$ respectively in the piezoelectric semiconductor rods 101 and 96 interact with drift electrons in the rods in a manner which serves to amplify the signals at the expense of energy derived from batteries 104 and 105. The reverse piezoelectric effect then results in signals at the frequencies $f_1$ and $f_p$ to be introduced into the cavity 100. Variations in the capacitance of the variable capacitance device 97 in the cavity 100 caused by the signals $f_p$ then causes parametric amplification of the signals $f_1$ to take place within the cavity 100. As a result amplified signals at the frequency $f_1$ are provided via the coaxial cable 115 to the utilization device 116. Thus it will be seen in FIGURE 4 that the signals $f_1$ and $f_p$ are amplified in individual compressional wave amplification devices and then parametric amplification of the signals $f_1$ takes place in the cavity 100.

The embodiment of the invention illustrated in FIGURE 5 is similar to that of FIGURE 1 in that a pair of RF resonant cavities 120 and 121 defined by the conductive members 122 and 123 are each tuned to frequencies $f_1$ and $f_p$. Suitable re-entrant support cylinders are provided to hold a compressional wave amplification device including a rod of piezoelectric semiconductor material 124 having depletion layer semiconductor devices 125 and 126 respectively connected to the ends thereof and disposed within the cavities 121 and 120. An electric field is established from end to end of the device 124 by the battery 127 having its negative terminal connected to the conductive member 123 and its positive terminal connected to the conductive member 122. Re-entrant posts 128 and 129 within the cavities 121 and 120 serve to concentrate the field. Signals at frequency $f_1$ are received by the receiver 130 and introduced into the cavity 121 by the terminated coaxial cable 131. Pump signal energy at the frequency $f_p$ is provided by a pump source 132 and introduced into the cavity 121 by the terminated coaxial cable 133. Amplified output signals at frequency $f_1$ are provided to a utilization device 135 by a coaxial cable 136 which is terminated in the cavity 120. As in the previous embodiments, the variation of capacitance of the device 125 in cavity 121 caused by the signals $f_p$ will cause parametric amplification of the signals at frequency $f_1$ to take place at the expense of energy derived from the pump source 132. Compressional waves at the frequencies $f_1$ and $f_p$ will also be launched in the piezoelectric material 124. The interaction of the compressional waves with the drift electrons which are subjected to the electric field of battery 127 will cause amplification of the compressional waves. The reverse piezoelectric effect at the right end of rod 124 will then cause signals $f_1$ and $f_p$ to be introduced into cavity 120. The variations in capacitance of the device 126 caused by the signals at frequency $f_p$ will then cause parametric amplification of the signals $f_1$ in cavity 120. The device 126 further aids in the coupling of the compressional wave energy to RF energy. Amplified signals at frequency $f_1$ are therefore provided to the utilization device 135 by the coaxial cable 136 which is coupled with the cavity 120. This amplification is achieved by the use of a low power pump source and energy obtained from direct current potential means.

It should be noted in connection with the variable capacitance devices described in each of the above embodiments of the invention that certain materials exhibit not only a variation in capacitance in response to a variation of applied electric field intensity but also exhibit piezoelectric characteristics. For example, quartz crystals are known to exhibit variations in capacitance and also to exhibit piezoelectric characteristics. Therefore such material can be used as the capacitance varying devices in the above embodiments and as a result of the piezoelectric characteristic thereof coupling of electromagnetic energy to compressional wave energy as well as from compressional energy into electromagnetic energy is enhanced. Such a device therefore serves as a variable capacitance device and simultaneously as a transducer to couple energy into and out from the compressional wave amplification apparatus.

A plurality of the amplifier devices can be connected in parallel using a plurality of resonant cavities, and also the apparatus can be used in channel wave guides to utilize the broad band amplification characteristics of the electron-compressional wave interaction. Materials such as cadmium sulfide and others known to exhibit the desired piezoelectric characteristics while also being capable of sustaining a flow of free electrons in response to an applied electric field are well suited for use in the apparatus of the present invention. Any of a number of variable capacitance devices such as those set forth above will similarly suffice as part of the apparatus.

There has thus been disclosed an improved high frequency amplifier which combines parametric amplification techniques and electron-compressional wave interaction amplification techniques in a manner which materially reduces the power requirements of the pump energy source. The power output of very high frequency pump sources is usually quite limited and therefore the invention is of particular value in high frequency applications. Those modifications which are obvious to one skilled in the art from the teachings of the invention are intended to be encompassed by the following claims.

What I claim is:

1. An amplifier comprising in combination: an amplification element having a variable capacitance first section and a piezoelectric second section; means applying an electron accelerating field to said second section; means resonant at first and second frequencies coupled with said first section; means coupled with said element applying signals thereto at said first frequency causing compressional waves to be launched in said second section and variations in the capacitance of said first section; means coupled with said element applying signals at said second frequency thereto; and signal output means coupled with said element.

2. An amplifier in accordance with claim 1 wherein said amplification element includes a variable capacitance third section and wherein said amplifier includes second means resonant at said first and second frequencies coupled with said third section.

3. An amplifier in accordance with claim 1 wherein said means coupled with said first section applying signals at said second frequency comprises: a second amplification element having a variable capacitance first section coupled with said means resonant at first and second frequencies and a piezoelectric second section; signal receiving means coupled with said second section of said second element adapted to launch compressional waves therein; and bias means applying an electron accelerating field to said second section of said second element.

4. An amplifier in accordance with claim 1 wherein said first section is a depletion layer semiconductor device and said second section is a rod of cadmium sulfide.

5. An amplifier comprising in combination: an element including a piece of piezoelectric semiconductor material and variable capacitance means secured to said piece of material; a pump signal source; means coupling signals from said source to said material to cause compressional waves to be launched therein; means applying signals to be amplified to said variable capacitance means; signal output means coupled with said element; and means coupled with said material applying an electron accelerating field thereto.

6. An amplifier comprising in combination: a rod of semiconductor material having piezoelectric characteristics; means coupled to said rod of material applying an electric field thereto to accelerate electrons therein; a variable capacitance device secured to said rod of material; means resonant at first and second frequencies coupled with said device; means applying signals at said first and second frequencies to said means resonant at said frequencies; and signal output means coupled with said rod.

7. An amplifier in accordance with claim 6 wherein said signal output means includes circuit means connected to said rod of material and tuned to the difference in frequency between said first and second frequencies.

8. An amplifier comprising in combination: an amplification member including first and second variable capacitance sections and a piezoelectric section disposed between said variable capacitance sections; a first signal source providing signals at a first frequency coupled with one of said variable capacitance sections; signal input means coupled with one of said variable capacitance sections; means resonant at said first frequency and at the frequency of a signal provided by said input means coupled with one of said variable capacitance sections; electric bias means coupled with said piezoelectric section establishing an electric field therein; and signal output means coupled with said member.

9. An amplifier comprising in combination: means defining a first cavity resonant at first and second frequencies; an amplification element including a variable capacitance first section and a piezoelectric second section, said first section being disposed in energy exchange relation with said cavity; electric bias means applying an electric field to said second section to cause release and acceleration of electrons therein; a pump signal source operable at said first frequency coupled with said element adapted to launch compressional waves in said second section and cause variations in the capacitance of said first section; signal input means coupled with said cavity adapted to provide signals at said second frequency thereto; and signal sensing means coupled with said element.

10. An amplifier in accordance with claim 9 wherein said element includes a variable capacitance third section, and further including: means defining second cavity resonant at said first and second frequencies and having said third section disposed therein; and signal feed-back means interconnecting said cavities.

11. An amplifier in accordance with claim 10 wherein said pump signal source is directly coupled with said first cavity.

12. An amplifier in accordance with claim 9 wherein said pump signal source is directly coupled with said cavity and wherein said signal sensing means includes frequency selective circuit means directly connected to said element.

13. An amplifier comprising in combination: means defining first and second resonant cavities at least one of which is resonant at first and second frequencies; a rod of semiconductor material having piezoelectric characteristics; first and second variable capacitance devices respectively connected to opposite ends of said rod and each disposed in energy exchange relationship with a different one of said cavities; electric field means establishing an electric field longitudinally in said rod; a pump signal source providing signals at said first frequency coupled with one of said cavities; signal input means providing signals at said second frequency coupled with one of said cavities; and signal output means coupled with one of said cavities.

14. An amplifier in accordance with claim 13 including signal feed-back means interconnecting said cavities.

15. An amplifier in accordance with claim 13 wherein said signal source and said signal input means are coupled with the same cavity.

16. An amplifier comprising in combination: means defining first and second cavities each resonant at first and second frequencies; a first variable capacitance device disposed in said first cavity; a second variable capacitance device disposed in said second cavity; a rod of piezoelectric semiconductor material connected to said first and second devices; bias means establishing an electric field in said rod of material in a direction to accelerate electrons therein toward said second cavity; means applying signals at said first and second frequencies to said first cavity; signal output means coupled with one of said cavities; and means providing signal coupling between said cavities.

17. An amplifier comprising in combination: means defining a first resonant cavity; first and second amplifier elements each including a variable capacitance first section section disposed in said cavity and a piezoelectric second section; bias means coupled with said second sections applying an electron accelerating field thereto in a accelerate electrons in each of said second sections toward said cavity; a pump signal source coupled with said second section of said first element adapted to launch compressional waves therein; signal receiving means coupled with said second section of said second element adapted to launch compressional waves therein; and a signal output circuit coupled with said cavity.

18. An amplifier comprising in combination: means defining a first cavity resonant at a first frequency, a second cavity resonant at a second frequency, and a third cavity resonant at said first and second frequencies; a first amplification element including a variable capacitance first section disposed in said third cavity and a piezoelectric second section coupled with said first cavity; means applying signals at said first frequency to said first cavity and launching compressional waves in said second section; a second amplification element including a variable capacitance first section disposed in said third cavity and a piezoelectric second section coupled with said second cavity; means applying signals at said second frequency to said second cavity and launching compressional waves in said second section of said second element; means applying electron accelerating fields to said second sections in directions to accelerate electrons in each of said second sections toward said third cavity; and a signal output circuit coupled with said third cavity.

19. An amplifier comprising in combination: a rod of semiconductor material; means establishing an electric field in said rod and causing the release of free electrons therein; means coupled with one end of said rod adapted to launch compressional waves therein at a first frequency; a variable capacitance device secured to one end of said rod; resonant means coupled with said device and resonant at said first frequency and at a second frequency; signal input means coupled with said resonant means output circuit coupled with said device.

20. An amplifier comprising in combination: a rod of piezoelectric semiconductor material; bias means establishing an electric field longitudinally in said rod, means coupled with one end of said rod and operative to launch compressional waves in said rod at first and second frequencies, and means including a signal output circuit connected to the other end of said rod adapted to provide output electrical signals in response to compressional waves of a selected frequency arriving at said other end of said rod.

No references cited.

ROY LAKE, *Primary Examiner.*

UNITED STATES PATENT OFFICE

CERTIFICATE OF CORRECTION

Patent No. 3,187,192 June 1, 1965

Ervin J. Nalos

It is hereby certified that error appears in the above numbered patent requiring correction and that the said Letters Patent should read as corrected below.

Column 10, line 74, strike out "section"; column 11, line 2 before "accelerate" insert -- direction to --.

Signed and sealed this 19th day of October 1965.

(SEAL)
Attest:

ERNEST W. SWIDER
Attesting Officer

EDWARD J. BRENNER
Commissioner of Patents